(12) United States Patent
Kim et al.

(10) Patent No.: US 6,292,042 B1
(45) Date of Patent: Sep. 18, 2001

(54) PHASE SPLITTER

(75) Inventors: Ha Soo Kim; Sung Ho Wang, both of Seoul; Tae Hyung Kim, Kyungki-do, all of (KR)

(73) Assignee: Hyundai Electronics Industries Co, Ltd., Kyoungki-do (KR)

( * ) Notice: Subject to any disclaimer, the term of this patent is extended or adjusted under 35 U.S.C. 154(b) by 0 days.

(21) Appl. No.: 09/295,403

(22) Filed: Apr. 21, 1999

(30) Foreign Application Priority Data

Apr. 25, 1998 (KR) .................................................. 98-14845

(51) Int. Cl.[7] .................................................. H03H 11/16
(52) U.S. Cl. ........................................... 327/257; 327/259
(58) Field of Search .................................. 327/239, 256, 327/257, 258, 259

(56) References Cited

U.S. PATENT DOCUMENTS

| | | | |
|---|---|---|---|
| 4,456,837 | * | 6/1984 | Schade, Jr. ............................ 327/259 |
| 5,047,659 | * | 9/1991 | Ullrich .................................. 327/259 |
| 5,592,115 | * | 1/1997 | Kassapian . |
| 5,637,998 | * | 6/1997 | Kushihara . |
| 5,852,378 | * | 12/1998 | Keeth .................................... 327/259 |
| 5,867,043 | * | 2/1999 | Kim ...................................... 327/257 |

* cited by examiner

Primary Examiner—Kenneth B. Wells
Assistant Examiner—Paul Dinh

(57) ABSTRACT

A phase splitter is disclosed for preventing a timing loss from a presentation timing mismatch of a clock signal of a phase equal to a reference signal and a clock signal of a phase inverted from the reference signal, including a semiconductor device for providing a signal of the same phase and a signal of an inverted phase with respect to a received reference signal, the semiconductor device including a first and a second transmission gates for receiving the reference signal and an inverted version of the received reference signal, and a third and a fourth transmission gates for receiving the reference sign, and the inverted version of that reference signal and for generating a signal having the same phase as the received reference signal and for providing that signal at the same time that the first and second transmission gates provide their output signal, the signals output by the first and second transmission gates having the same timing and opposite phase as the signal output by the third and fourth transmission gates with respect to the reference signal.

19 Claims, 4 Drawing Sheets

PHASE SPLITTER

BACKGROUND OF THE INVENTION

1. Field of the Invention

The present invention relates to a semiconductor device, and more particularly, to a phase splitter for receiving a clock signal and for providing clock signals of similar and opposite phases when compared to the received clock signal at the same time.

2. Discussion of the Related Art

The clock signal, when used as a driving signal for a system, should have a high frequency for driving the system faster. However, since clock signal frequencies are limited, two clock signals are sometimes jointly used as a received clock signal clk_in to increase system speed, i.e., a clock signal clk having a phase equal to the received clock signal clk_in and a clock signal clk_b having a phase that is inverted with respect to the received clock signal clk_in. A background art phase splitter conventionally used to achieve these joint clock signals will be explained with reference to the attached drawings.

FIG. 1 illustrates the background art phase splitter.

Referring to FIG. 1, the background art phase splitter is provided with a first inverter 11 for inverting a phase of a received signal, a second inverter 12 for inverting an output of the first inverter 11 to provide a clock signal having a phase equal to the received signal at the end, a third inverter 13 for inverting a phase of the received signal, a fourth inverter 14 for inverting an output of the third inverter 13, and a fifth inverter 15 for inverting an output of the fourth inverter 14 to provide a clock signal having a phase opposite to the received signal. Each of the inverters has a PMOS transistor and an NMOS transistor.

The operation of the aforementioned background art phase splitter will be explained with reference to the timing diagram of FIG. 2. There is a delay, as much as td1, from reception of a clock signal clk_in to an output of a clock signal clk having the same phase. That is, the received clock signal clk_in is phase inverted by the first inverter 11 and phase inverted again by the second inverter 12. Accordingly, though a signal from the second inverter 12 has a phase equal to the received clock signal, there is a delay of as much as td1 caused by the first and second inverters 11 and 12. On the other hand, there is a delay of as much as td2 between reception of the clock signal clk_in to an output of an inverted clock signal clk_b. That is, the received clock signal clk_in is phase inverted by the third inverter 13, inverted a second time by the fourth inverter 14, and inverted a third time by the fifth inverter 15. At the end, the clock signal clk_b has an inverted phase and a delay of as much as td2 with respect to the received clock signal clk_in. Thus, the background art phase splitter provides a clock signal having a phase equal to a received clock signal and a clock signal having a phase opposite to the received clock signal using inverters.

However, the background art phase splitter has at least the following problems.

The two clock signals, i.e., clk and clk_b have a timing mismatch of as much as td2. Even if sizes of transistors in the inverters are adjusted to take the timing mismatch into consideration, the timing mismatch is still likely to exist due to variations of a fabrication process or variations of a voltage and temperature.

Moreover, conventional phase splitters divided an input clock signal clk_in into two signals, a first clock signal clk having a phase equal to the input clock signals clk_in, and a second clock signal clk_b having a phase that is opposite to the input clock signal clk_in as shown in FIG. 1, and even numbered series arrangement of inverters was used to generate first clock signal clk, while an odd numbered series arrangement of inverters was used to generate second clock signal clk_b. Because each inverter introduces some delay (e.g., shown in FIG. 2 as td2 or ½ of td1), the even numbered and odd numbered series arrangements generate clock signals having different delays relative to the input clock signal clk_in. In other words, the first clock signal CLK is delayed by two units of inverter delay, while the second clock signal, clk_b is delayed by three units of inverter delay. For this reason, as shown in FIG. 2, although first and second clock signals clk and clk_b each have a phase equal to the phase of the input signals clk_in, first and second clock signals clk and clk_b are not synchronous with each other. This timing mismatch is not easily corrected during the phase splitter fabrication.

SUMMARY OF THE INVENTION

Accordingly, the present invention is directed to a phase splitter that substantially obviates one or more of the problems due to limitations and disadvantages of the related art.

The present invention provides a phase splitter which can prevent a timing loss from a presentation timing mismatch of a clock signal having a phase equal to, and a clock signal having a phase inverted from a received signal, which phase splitter is not sensitive to variations of a fabrication process, voltages, temperatures, and the like.

Additional features and advantages of the invention will be set forth in the description which follows, and in part will be apparent from the description, or may be learned by practice of the invention. Other advantages of the invention will be realized and attained by the structure particularly pointed out in the written description and claims hereof as well as the appended drawings.

To achieve these and other advantages and in accordance with the purpose of the present invention, as embodied and broadly described, the phase splitter includes a semiconductor device for providing a signal of the same phase and a signal of an inverted phase with respect to a received signal, the semiconductor device including a first, and a second transmission gates for providing the received signal, and a signal of an inverted phase with respect to the received signal at being determined of a turning on/off by a signal from an inverter which inverts the received signal, and a third, and a fourth transmission gates for providing the received signal, and a signal of the same phase with respect to the received signal at the same time with the providing of the signal of an inverted phase at being determined of a turning on/off by the signal from the inverter.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification and which are presented to illustrate examples of this invention and therefore should not limit this invention, illustrate embodiments of the invention and together with the description serve to explain the principles of the invention, wherein.

DETAILED DESCRIPTION OF THE PREFERRED EMBODIMENT

Reference will now be made in detail to the preferred embodiments of the present invention, examples of which are illustrated in the accompanying drawings.

Figure 1:
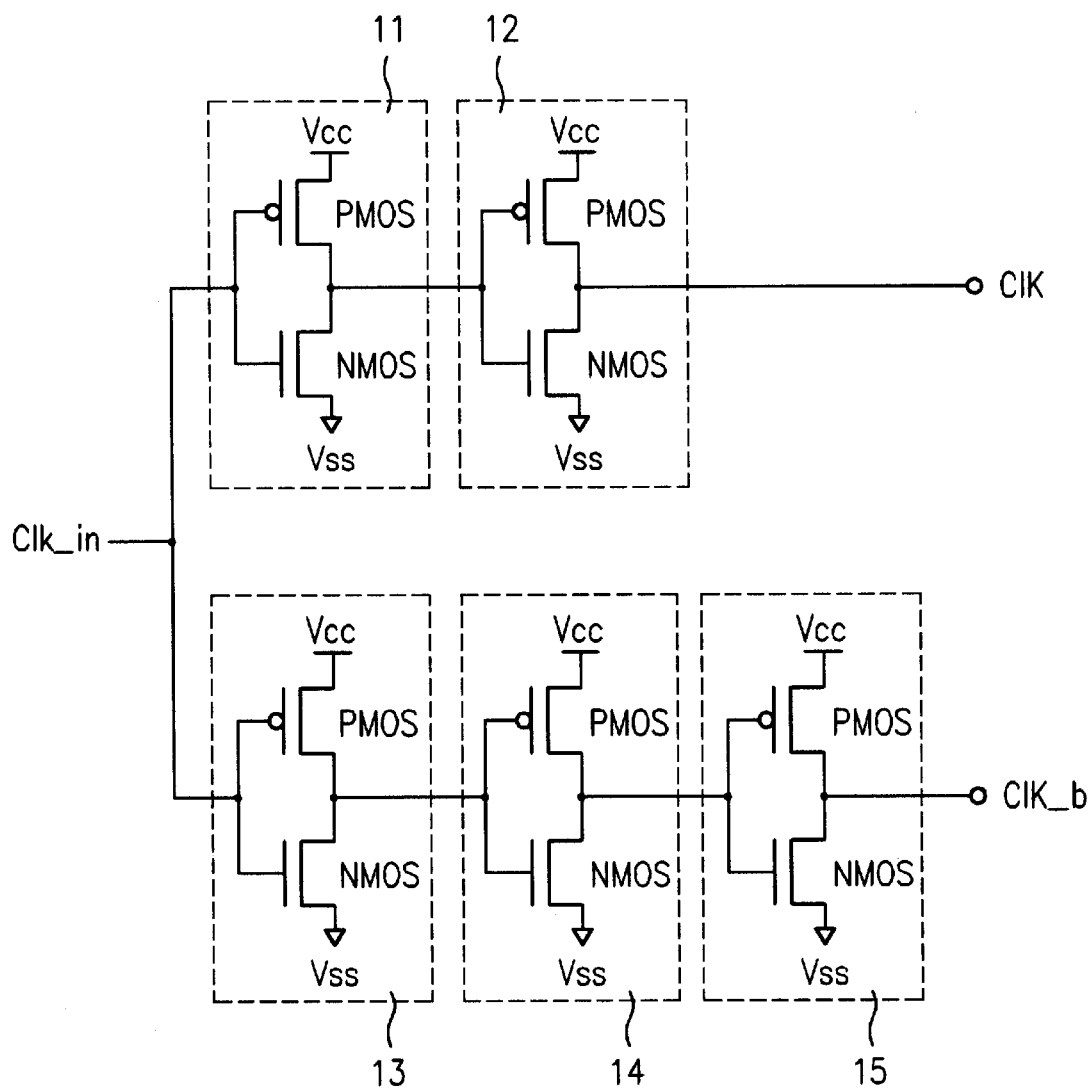
FIG. 1 illustrates a system of a background art phase splitter.
Figure 2:
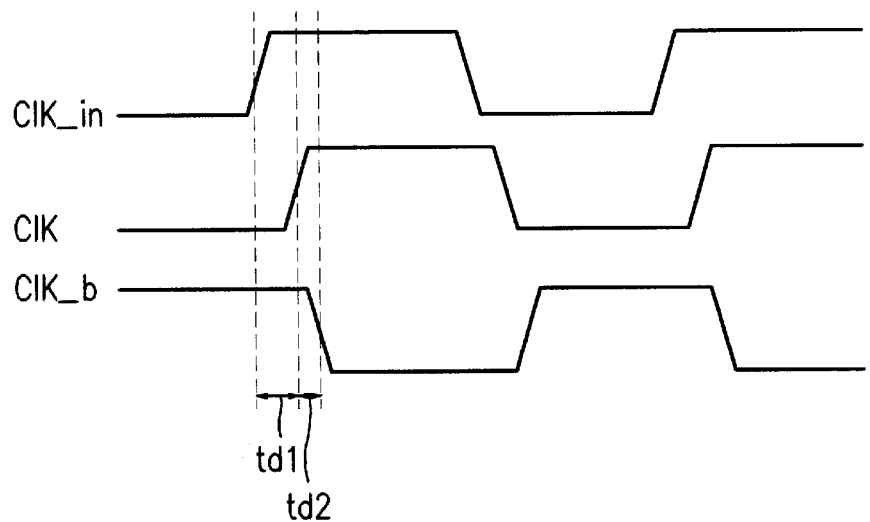
FIG. 2 illustrates operation waveforms of a background art phase splitter.
Figure 3:
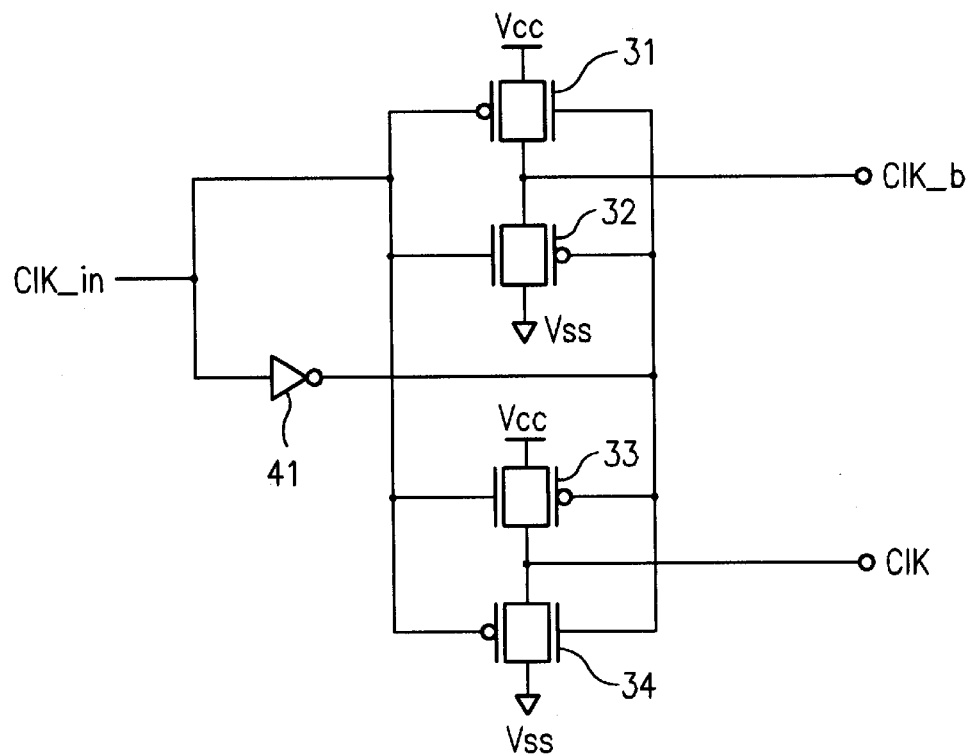
FIG. 3 illustrates a system of a phase splitter in accordance with a first embodiment of the present invention.

FIG. 3 illustrates a system of a phase splitter in accordance with a first embodiment of the present invention, including four transmission gates 31, 32, 33, and 34, and one inverter 41. Each of the transmission gates 31, 32, 33, and 34 includes a PMOS transistor and an NMOS transistor arranged with reversed relative orientation. A PMOS control terminal on the first transmission gate 31 and an NMOS control terminal on the second transmission gate 32 are adapted to receive an input signal clk_in. An NMOS control terminal on the first transmission gate 31 and a PMOS control terminal on the second transmission gate 32 are adapted to receive an inverted signal of the input signal clk_in. The signal applied to the PMOS control terminal on the second transmission gate 32 is inverted by the inverter 41. An NMOS control terminal on the third transmission gate 33 and a PMOS control terminal on the fourth transmission gate 34 are adapted to receive the input signal clk_in. A PMOS control terminal on the third transmission gate 33 and an NMOS control terminal on the fourth transmission gate 34 are adapted to receive an inverted signal of an input clock signal. In this instance, a clock signal clk having a phase equal to the received clock signal clk_in is provided selectively according to the on/off operation of the third transmission gate 33 and the fourth transmission gate, and the clock signal of an inverted phase clk_b is provided selectively according to the on/off operation of the first transmission gate 31 and the second transmission gate 32. The first and third transmission gates 31 and 33 have input terminals connected to a source voltage terminal, and the second, fourth transmission gates have input terminals connected to a ground voltage terminal.

Figure 4:
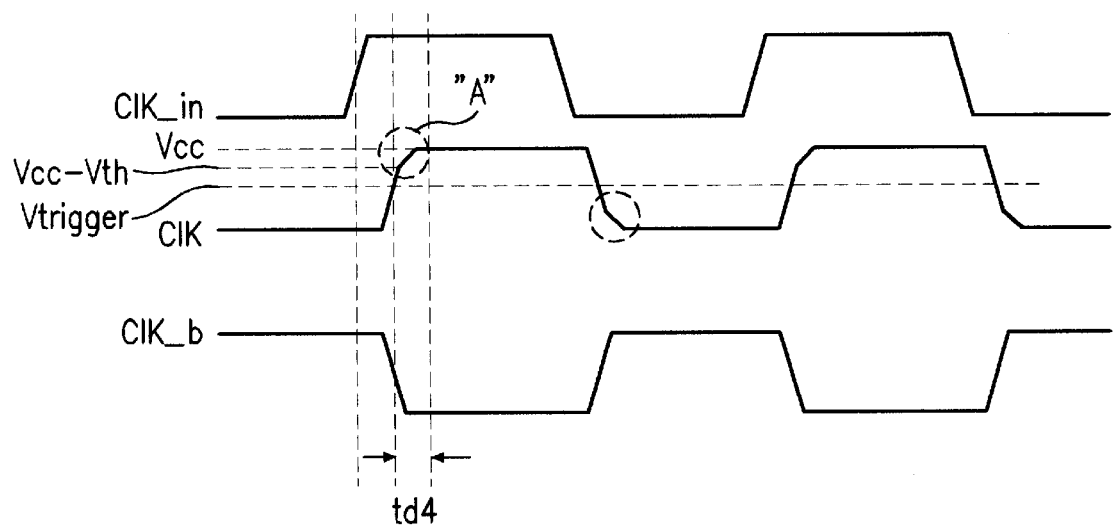
FIG. 4 illustrates operation waveforms of a phase splitter in accordance with a first embodiment of the present invention.

The operation of the aforementioned phase splitter in accordance with a first embodiment of the present invention will be explained with reference to FIGS. 3 and 4. FIG. 4 illustrates operation timing diagram of a phase splitter in accordance with a first embodiment of the present invention in which a clock signal clk_in is received and clock signals having phases equal and opposite to the received clock signals clk_in are provided.

Referring to FIG. 4, if the received clock signal clk_in experiences a transition from a low level to a high level, the received signal is applied to the PMOS control terminal on the first transmission gate 31, the NMOS control terminal on the second transmission gate 32, the NMOS control terminal on the third transmission gate 33, the PMOS control terminal on the fourth transmission gate 34 and the inverter 41. Once the high level clock signal clk_in passes through the inverter 41, the received clock signal clk_in has its phase inverted into a low level clock signal. An output of the inverter 41 is applied to the NMOS control terminal on the first transmission gate 31, the PMOS control terminal on the second transmission gate 32, the PMOS control terminal on the third transmission gate 33 and the NMOS control terminal on the fourth transmission gate 34, thereby turning on the second and third transmission gates 32 and 33 and turning off the first and fourth transmission gate 31 and 34. Eventually, the clock signal inverted with respect to the received clock signal becomes a low level ground signal Vcc provided through the second transmission gate 32. Thus, the clock signal having a phase equal to the received clock signal becomes a high level power source signal Vcc provided through the third transmission gate 33.

In this instance, as shown in FIG. 4, there is a delay of as much as td4 from reception of the received signal clk_in to an output of the clock signal clk having the same phase. Thus, a delay of as much as td2 between the clock signal clk having a same phase and a clock signal clk_b having an inverted phase, which is experienced by the background art, is avoided by in the first embodiment of the present invention, because paths from reception of the clock signal clk_in to output of clock signals of the same phase clk and the inverted phase clk_b are identical.

In the first embodiment of the present invention, as shown in FIG. 4, part "A", representing a pull-up and a pull-down of the clock signal, includes two stages. In the case of the clock signal of the same phase, a high signal is applied to the NMOS control terminal on the third transmission gate 33 when the received signal clk_in has a high level, so that a voltage of the clock signal clk drops as much as a threshold voltage Vth of the NMOS transistor in the third transmission gate 33, being pulled up as much as Vcc–Vth. However, since the third transmission gate 33 is a CMOS transmission gate, the third transmission gate 33 applies a low signal to the PMOS control terminal after a lapse of the delay time period td4. Upon application of the low signal, the clock signal of the same phase clk is pulled up for the first time to Vcc, completely. In the first embodiment of the present invention, though the clock signal is pulled-up or pulled down in two stages, regular clock operations are not affected by these stages so long as the voltage Vcc–Vth is greater than a trigger voltage Vtrigger.

Figure 5:
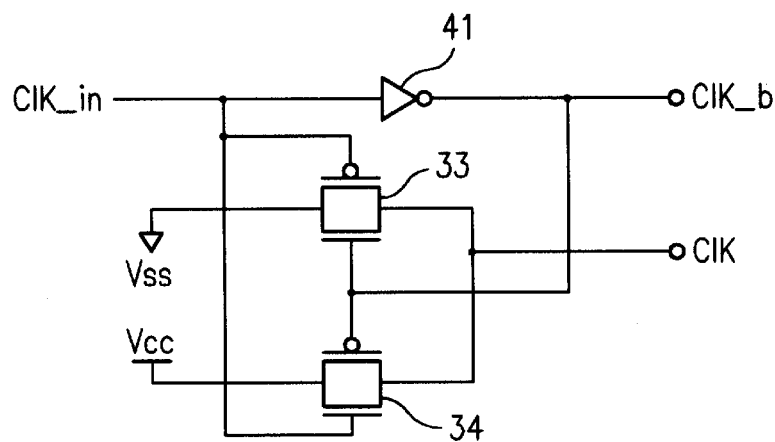
FIG. 5 illustrates a system of a phase splitter in accordance with a second embodiment of the present invention.

FIG. 5 illustrates a system of a phase splitter in accordance with a second embodiment of the present invention, including one inverter 41 and two transmission gates 31 and 32. Because the first and second transmission gates 31 and 32 of the first embodiment convert the received clock signal, they are replaced with the inverter 41 in the second embodiment, enabling generation of a simplified circuit system.

That is, referring to FIG. 5, the phase splitter in accordance with a second embodiment of the present invention includes the inverter 41 for receiving a clock signal clk_in and for inverting a phase of the received clock signal, a first transmission gate 33 having a PMOS control terminal applied with the received signal clk_in and an NMOS control terminal applied with an output from the inverter 41, and a second transmission gate 34 having an NMOS control terminal applied with the received clock signal clk_in and a PMOS control terminal applied with an output from the inverter 41. A clock signal having a phase equal to the received clock signal clk_in is output from between the first and second transmission gates 33 and 34. According to the second embodiment of the present invention, the received clock signal clk_in causes the first and second transmission gates 33 and 34 to operate, selectively. If the received clock signal has a high level, the NMOS in the second transmission gate 34 starts, and if the received clock signal has a low level, the PMOS in the first transmission gate starts the operation.

For illustration purposes, the following provides the description of operations when the received clock signal has a high level. The NMOS in the second transmission gate 34 is turned on by the high level received clock signal, and the PMOS in the second transmission gate 34 is turned on as the received clock signal passes through the inverter 41 to apply a low signal to the PMOS control terminal, providing a power Vcc signal through the second transmission gate as a clock signal clk of the same phase. Eventually, as shown in FIG. 5, even though an inverter is provided in place of the two transmission gates that invert a phase, the clock signal of the same phase clk and the clock signal of an inverted phase clk_b have the same output timings because the delay from the inverter is compensated by the transmission gate. Operation waveforms of the phase splitter of the second embodiment of the present invention are the same as in the first embodiment.

Figure 6:
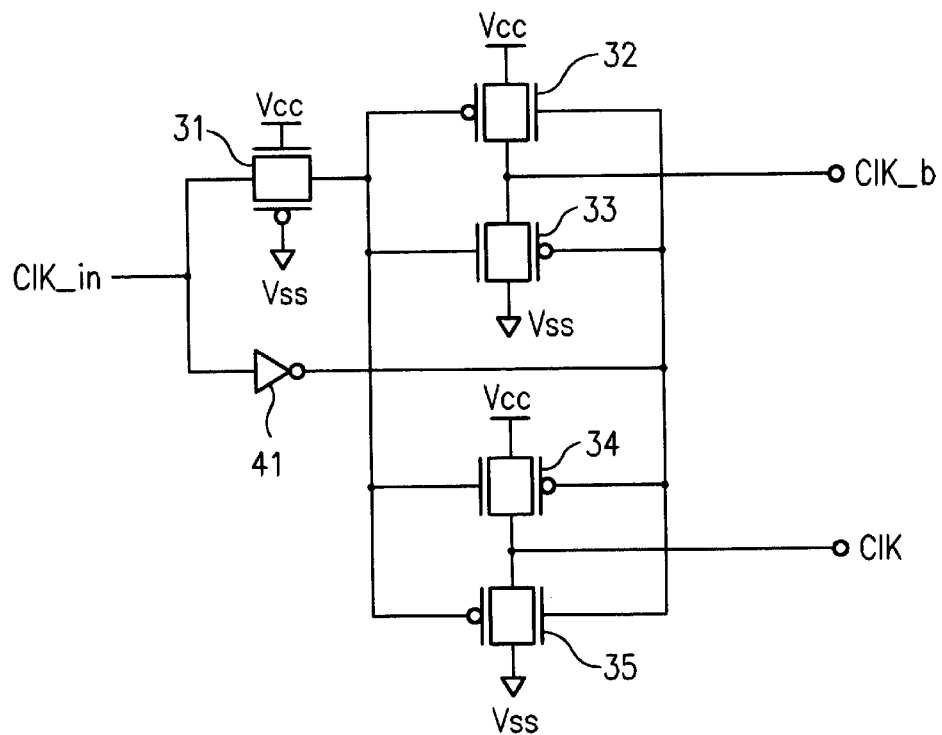
FIG. 6 illustrates a system of a phase splitter in accordance with a third embodiment of the present invention; and, FIG. 7 illustrates operation waveforms of a phase splitter in accordance with a third embodiment of the present invention.

FIG. 6 illustrates a system of a phase splitter in accordance with a third embodiment of the present invention. This third embodiment phase splitter eliminates the two stage pull-up and pull-down of the clock signal required by the first embodiment. That is, in the first embodiment, the turn-on times of the NMOS transistor and the PMOS transistor in the third and fourth transmission gates 33 and 34 have a slight difference in forwarding the clock signal of the same phase by turning on/off of the third and fourth transmission gates 33 and 34. Because the NMOS control terminal is directly applied with the received clock signal clk_in, the PMOS control terminal is applied with the received clock signal clk_in with a delay of as much as the delay caused by the inverter 41. As explained, the delay by the inverter 41 affects nothing during regular clock operation. Nevertheless, in the third embodiment, the NMOS transistor and the PMOS transistor in the third and fourth transmission gates 33 and 34 are matched with the turned on time points to pull-up and pull-down the clock signal in a single stage.

Figure 7:
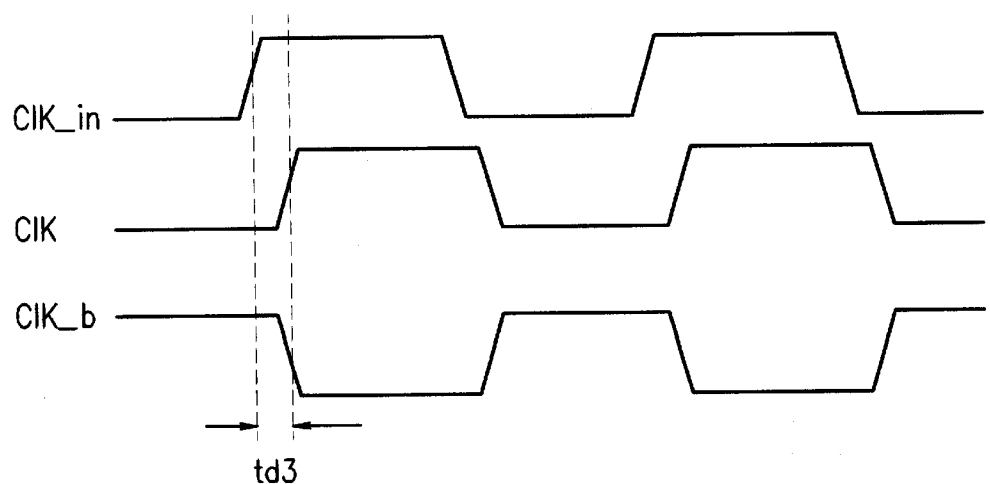

That is, referring to FIG. 6, the third embodiment phase splitter of the present invention includes five transmission gates and one inverter, i.e., a first transmission gate 31 having an NMOS control terminal adapted to be applied of a power signal and a PMOS control terminal adapted to be applied with a ground signal for providing a received clock signal, an inverter 41 for inverting the received clock signal, a second transmission gate 32 having a PMOS control terminal adapted to be applied with a signal from the first transmission gate 31 and an NMOS control terminal adapted to be applied with a signal from the inverter 41 for selectively providing the power signal of an inverted phase with respect to the received signal, a third transmission gate 33 having an NMOS control terminal adapted to be applied with a signal from the first transmission gate 31 and a PMOS control terminal adapted to be applied with a signal from the inverter 41 for selectively providing the ground signal of an inverted phase with respect to the received signal, a fourth transmission gate 34 having an NMOS control terminal adapted to be applied with a signal from the first transmission gate 31 and a PMOS control terminal adapted to be applied with a signal from the inverter 41 for providing the power signal of the same phase with respect to the received signal, and a fifth transmission gate 35 having a PMOS control terminal adapted to be applied with a signal from the first transmission gate 31 and an NMOS control terminal adapted to be applied with a signal from the inverter 41 for providing the ground signal of the same phase with respect to the received signal. The reception terminals of the second and fourth transmission gates 32 and 34 are connected to the power voltage terminal Vcc, and the reception terminals of the third and fifth transmission gates 33 and 35 are connected to a ground voltage terminal Vss. Accordingly, the power signal or ground signal, which are selectively provided as the second and third transmission gates 32 and 33 are turned on/off, are used as the clock signals of inverted phases. And, the power signal or ground signal, which are selectively provided as the fourth and fifth transmission gates 34 and 35 are turned on/off, are used as the clock signals of the same phases. To do this, as shown in FIG. 6, the received signal clk_in is adapted to pass through the first transmission gate 31 before being applied to the NMOS control terminal on the fourth transmission gate 34, thus being delayed by a delay time (e.g., td3) equal to the delay time introduced by inverter 41, so that the signal applied to the PMOS control terminal on the fourth transmission gate 34 is compensated by the received signal clk_in applied to the NMOS control terminal of fourth transmission gate 34. A similar process is experienced by third transmission gate 33. Accordingly, unlike the first embodiment of the present invention in which the clock signal is pulled-up and pulled-down in two stages, the clock signal is pulled-up and pulled-down in a single stage in the third embodiment of the present invention. Shown in FIG. 7 is a timing diagram of the aforementioned third embodiment phase splitter of the present invention. From FIG. 7, it can be known that not only a clock signal of the same phase and a clock signal of an inverted phase with respect to a received signal are provided at the same time, but also a voltage of the clock signal is pulled-up or pulled-down at a single stage.

The phase splitter of the present invention has at least the following advantages.

The matched presentation of a clock signal clk of the same phase and a clock signal clk_b of an inverted phase with respect to a received clock signal may be achieved without experiencing a timing loss. The use of transmission gates in place of the inverter prevents variations of an output timing of the clock signal since the phase splitter becomes less sensitive to variations of fabrication process, temperatures, and voltages.

It will be apparent to those skilled in the art that various modifications and variations can be made in the phase splitter of the present invention without departing from the spirit or scope of the invention. Thus, it is intended that the present invention cover the modifications and variations of this invention provided they come within the scope of the appended claims and their equivalents.

What is claimed is:

1. A phase splitter comprising:
a first circuit to provide a first output signal with a phase defined by a phase of an input signal;
a second circuit to provide a second output signal with a phase defined by inverting the phase of the input signal; and
an inverter to invert the input signal and to supply an inverted input signal to the first and second circuits,
wherein the first and second circuits each receive the input signal, the inverted input signal, a reference voltage, and a supply voltage,
wherein the first circuit comprises:
a first transmission gate having a PMOS transistor with a control terminal adapted to be applied with the input signal and an NMOS transistor with a control terminal adapted to be applied with a signal from the inverter, the first transmission gate selectively providing a high level signal;

a second transmission gate having an NMOS transistor
        with a control terminal adapted to be applied with the
        input signal and a PMOS transistor with a control
        gate adapted to be applied with a signal from the
        inverter, the second transmission gate selectively
        providing a low level signal, and
    wherein the second circuit comprises:
        a third transmission gate having an NMOS transistor
            with a control terminal adapted to be applied with
            the input signal and a PMOS transistor with a
            control gate adapted to be applied with a signal
            from the inverter, the third transmission gate
            selectively providing a high level signal; and,
        a fourth transmission gate having a PMOS transistor
            with a control terminal adapted to be applied with
            the input signal and an NMOS transistor with a
            control gate adapted to be applied with a signal
            form the inverter, the fourth transmission gate
            selectively providing a low level signal, wherein,
            at a low level of the input signal, the fourth
            transmission gate is operative to provide a low
            level signal having a phase that is equal to the
            input signal, and the first transmission gate is
            operative to provide a high level signal having a
            phase that is inverted relative to the input signal.

2. A phase splitter as claimed in claim 1,
    wherein the first circuit includes first and second transmission gates being provided with the input signal and the inverted input signal; and
    wherein the second circuit includes third and a fourth transmission gates being provided with the input signal and the inverted input signal.

3. A phase splitter as claimed in claim 2, wherein the first transmission gate operates to provide the second output signal having a phase that is inverted with respect to the input signal and the fourth transmission gate operates to provide the first output signal having a phase equal to the input signal when the input signal has a low level.

4. A phase splitter as claimed in claim 3, wherein a reference voltage is provided through the fourth transmission gate and a supply voltage is provided through the first transmission gate.

5. A phase splitter as claimed in claim 2, wherein the second transmission gate is operated to provide the first output signal having an inverted phase relative to the input signal and the third transmission gate is operated to provide the second output signal having a phase equal to the input signal when the input signal has a high level.

6. A phase splitter as claimed in claim 5, wherein a reference is provided to the third transmission gate and a supply voltage is provided to the second transmission gate.

7. A phase splitter as claimed in claim 3, wherein each of the first and fourth transmission gates includes a PMOS transistor and an NMOS transistor, the PMOS transistors having gates adapted to be applied with the input signal in common, and the NMOS transistor having gates supplied with an inverted version of the input signal in common.

8. A phase splitter as claimed in claim 3, wherein each of the second and third transmission gates includes an NMOS transistor and a PMOS transistor, the NMOS transistors having gates adapted to be applied with the input signal in common, and the PMOS transistor having gates adapted to be applied with a signal having an inverted phase relative to the input signal in common.

9. A phase splitter as claimed in claim 3, wherein, after the input signal is triggered, a signal having a phase equal to the input signal and a signal having a phase that is inverted relative to the input signal are provided synchronously with a same delay relative to the input signal.

10. A phase splitter as claimed in claim 1, wherein a reference voltage is provided through the fourth transmission gate, and a supply voltage is provided through the first transmission gate.

11. A phase splitter as claimed in claim 1, wherein, at a high level of the input signal, the third transmission gate is operative to provide a high level signal having a phase that is equal to the input signal, and the second transmission gate is operative to provide a low level signal having a phase that is inverted relative to the input signal.

12. A phase splitter as claimed in claim 11, wherein a supply voltage is provided through the third transmission gate, and a reference voltage is provided through the second transmission gate.

13. A phase splitter as claimed in claim 1, further comprising:
    a third circuit that delays the input signal to generate a delayed input signal, wherein the delayed input signal is supplied to the first and second circuits.

14. A phase splitter as claimed in claim 13, wherein a delay time period caused by the third circuit is equal to a delay time period caused by the inverter.

15. A phase splitter comprising:
    an inverter that inverts a received signal to generate an inverted signal;
    a first transmission gate that delays the received signal to generate a delayed signal;
    a second transmission gate receiving the inverted and delayed signals and generating a signal having a phase that is inverted relative to the received signal when the received signal has a low level;
    a third transmission gate receiving the inverted and delayed signals and generating a signal having a phase that is inverted relative to the received signal when the received signal has a high level;
    a fourth transmission gate, adapted to be operative With the third transmission gate, receiving the inverted and delayed signals and generating a signal having a phase that is the same as the phase of the received signal; and,
    a fifth transmission gate, adapted to be operative with the second transmission gate, receiving the inverted and delayed signals and generating a signal having a phase that is the same as a phase of the received signal.

16. A phase splitter as claimed in claim 15, wherein delay time periods caused by the first transmission gate and the inverter are identical.

17. A phase splitter as claimed in claim 15, wherein the second transmission gate provides a power voltage and the fifth transmission gate provides a ground voltage when the received signal has a low level.

18. A phase splitter as claimed in claim 15, wherein the third transmission gate provides a ground voltage and the fourth transmission gate provides a power voltage when the received signal has a high level.

19. A phase splitter as claimed in claim 17, wherein operation timings of the transmission gates are the same, the transmission gates being connected to the output terminals both on the first transmission gate and the inverter for being operative according to the received signal.

* * * * *